Figure 1:
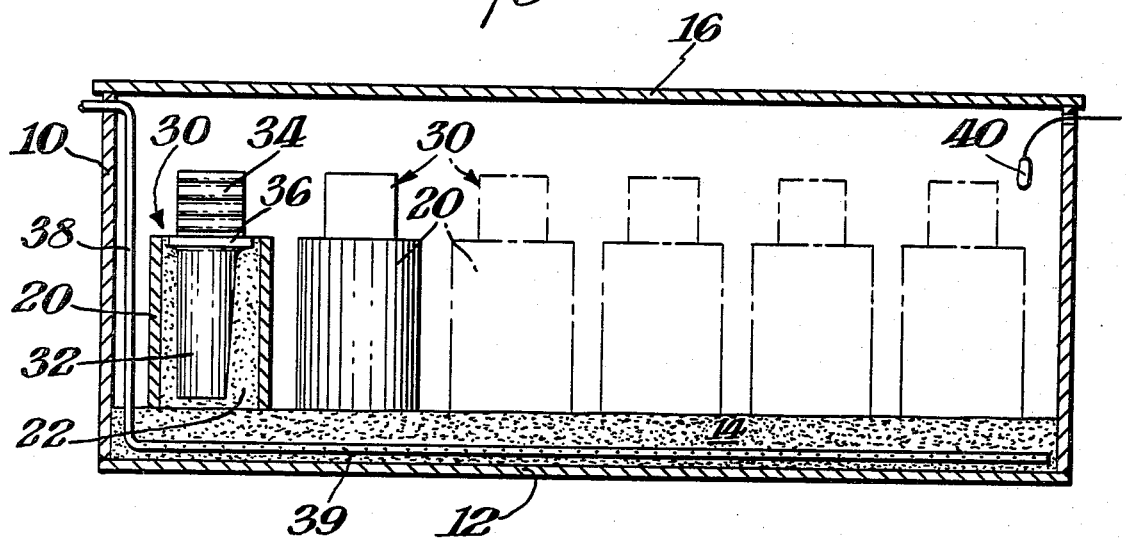

United States Patent [19]

Baldi

[11] 4,290,391

[45] Sep. 22, 1981

[54] DIFFUSION TREATED ARTICLES

[75] Inventor: Alfonso L. Baldi, Wynnewood, Pa.

[73] Assignee: Alloy Surfaces Company, Inc., Wilmington, Del.

[21] Appl. No.: 98,654

[22] Filed: Nov. 29, 1979

Related U.S. Application Data

[63] Continuation-in-part of Ser. No. 25,456, Mar. 30, 1979, Ser. No. 963,313, Nov. 24, 1978, abandoned, and Ser. No. 752,855, Dec. 21, 1976, Pat. No. 4,208,453.

[51] Int. Cl.³ .......................... C23C 9/02; B32B 1/08
[52] U.S. Cl. .......................... 122/511; 122/DIG. 13; 427/237; 427/239; 427/253; 428/653; 428/667
[58] Field of Search ........... 122/511, DIG. 13, 235 C, 122/465; 427/237, 239, 253; 428/653, 663; 165/133, 180; 237/67

[56] References Cited

U.S. PATENT DOCUMENTS 4,054,174 10/1977 Haller ........................ 122/DIG. 13

FOREIGN PATENT DOCUMENTS 699059 12/1930 France ........................ 122/DIG. 3
603313 6/1948 United Kingdom ................ 427/239

Primary Examiner—Ralph S. Kendall
Attorney, Agent, or Firm—Connolly and Hutz

[57] ABSTRACT

Chromized nickel- and cobalt-based superalloys have alphachrome phase formed during chromizing, and the amount of that phase is diminished by one or more treatments with alkali-permanganate solution and intervening removal of permanganate reaction product film as by acid dip. A kit of such solutions can be prepared. Low-alloy steel steam boiler tubing can have chromized interior and aluminized exterior, and long lengths chromized without a perfectly sealed retort around it can have end caps fitted with extra pack to reduce oxygen penetration to interior. Chain saw cutter blades can be chromized and carburized. Stripping of aluminized coatings from super-alloys with fluoride-containing nitric acid solution is improved by follow-up treatment with fluoride-free nitric acid solution. Smut that forms on ferrous surface during cleaning is chemically removed by first depositing a nickel flash plating on smut-containing surface, and then dissolving the nickel plating by treatment with aqueous nitric acid containing a little halide ion.

4 Claims, 2 Drawing Figures

DIFFUSION TREATED ARTICLES

The present application is in part a continuation of applications Ser. No. 25,456 filed Mar. 30, 1979, Ser. No. 963,313 filed Nov. 24, 1978, abandoned and Ser. No. 752,855 filed Dec. 21, 1976, U.S. Pat. No. 4,208,453 the entire contents of all three of which are incorporated herein as though fully set forth. Some of those contents are copied over herein.

The present invention relates to the treatment of metals to improve their usefulness.

Among the objects of the present invention is the provision of novel coating techniques as well as novel treating compositions and treated products, that have desirable properties.

Additional objects of the present invention include compositions and techniques for confining protective diffusion coatings to desired locations on workpieces such as jet engine components to be protected by the coatings.

Figure 2:
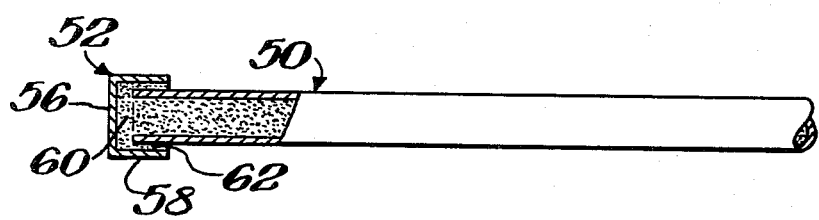

The foregoing as well as further objects of the present invention will be more fully understood from the following description of several of its exemplifications, reference being made to the accompanying drawings wherein:

FIG. 1 is a somewhat diagrammatic illustration of a set-up for diffusion coating pursuant to the present invention; and FIG. 2 is a longitudinal sectional view of one end of tubing prepared for a diffusion coating illustrative of the present invention.

One exemplification of a diffusion chromizing process of Ser. No. 963,313 is:

EXAMPLE 1

A cylindrical diffusion coating retort 10 as in FIG. 1, made of plain carbon steel, has its floor 12 covered to a depth of about 1½ inches with a layer composed of, by weight:

20 parts chromium powder 10 to 20 microns in size
80 parts tabular alumina granules 100 to 200 microns in size
¾ part NH$_4$Cl powder These ingredients are mixed together so as to make a layer of fairly uniform composition, and does not have to be pre-fired.

On layer 14 is placed a multiplicity of retaining tubes 20 also of plain carbon steel, each holding a B-1900 superalloy jet engine blade 30 the airfoil portion 32 of which is embedded in a diffusion coating pack 22. Pack 22 is composed of, by weight:

45 parts chromium powder 10 to 20 microns in size
23.5 parts nickel powder 10 to 50 microns in size
3.6 parts aluminum powder 20 to 100 microns in size
27.9 parts fine alumina powder that passes a 325 mesh screen
0.5 part NH$_4$Cl powder This mixture is pre-fired by heating for 10 hours in a plain carbon steel retort at 1900° F. in a hydrogen-bathed atmosphere without a workpiece, the pre-fired pack then crushed to pass a 200 mesh screen and 0.5 part NH$_4$Cl powder is added to it to make up for the NH$_4$Cl driven off by the pre-firing.

To avoid depleting some of the chromium from the pack 22 when it is subjected to the pre-firing, the pre-firing retort can be previously chromized, or can be a high-chromium alloy such as Inconel 600.

For loading tubes 20, the individual blades 30 are first held by fitting their roots 34 in apertures in a supporting table, these apertures being too small to receive blade flange 36. The airfoils 32 are thus pointed upward and a tube 20 is placed over each of them. The pre-prepared pack 22 is then poured into the tube and tamped in place so that it stays there and does not pour when the tube is inverted. The tube should have only a small clearance, about ½ centimeter or less, with respect to the blade flange 36 and support, to keep pack 22 from pouring out the bottom of the tube during the loading and tamping.

The tubes so loaded are then inverted and placed over layer 14 in retort 10, a gas supply tube 38 and thermocouple 40 inserted in the retort with the gas supply tube immersed in powder layer 14, the retort covered by a loosely fitting cover 16 or by placing another retort over its open top, and the assembly subjected to a diffusion coating heat in an outer retort through which hydrogen is passed as described in U.S. Pat. No. 3,764,371, while argon at a slow rate, about 5 standard cubic feet per hour is fed into retort 12 through tube 38 which has many perforations 39. The assembly is brought to 1925° F. and maintained within plus or minus 25 degrees of that temperature for 16 hours, after which it is permitted to cool.

The loaded tubes are removed from the cooled retort and the blades 30 removed from pack 22 after that pack is loosened as by jarring the tube. The roots 34 of the blades now show a case about 0.7 mil thick containing a maximum of about 35% chromium and a very small amount of alphachrome phase. The airfoils 32 on the other hand have a case with two chromium diffused zones. The outer zone is a little over 1 mil thick containing a maximum of about 75% chromium and is essentially alphachrome. The inner zone is essentially gamma nickel containing a maximum of about 35% chromium.

The coating technique of Example 1 is particularly desirable and when used to form chromized cases by a gas-phase chromizing as there shown for the blade roots, provides such cases with a minimum of alphachrome phase. Where such case is formed with a maximum chromium content of about 30% or less, no alphachrome phase at all can generally be detected. Combining the gas-phase coating with the pack coating as in Example 1, makes it unnecessary to provide separate supports for holding the workpieces exposed to the gas-phase.

In general the chromizing mixture 14 for the gas-phase coating can have as little as 2% and as much as 80% chromium, preferably 5 to 80%, and other inert diluents like fired kaolin can be used in addition to or in place of the alumina. The heavy chromizing pack 22 should have at least about 2% aluminum to minimize the formation of oxide inclusions, but its nickel content can be reduced to about the same level as the aluminum content. Its chromium content should be at least about 40%, preferably at least 60%, of the total of all its metallic ingredients, and the aluminum content should be not more than one-fifth, preferably not more than one-ninth, the chromium content. Other activators such as ammonium bromide, elemental iodine and ammonium bifluoride can be used.

There should be sufficient inert diluent, for instance at least about 25% by weight, in the pack 22 as well as in mixture 14, to keep the metal particles in them from sintering together or to the workpiece, tube or retort. It is also helpful to have pack 22 of such non-fluent nature that the packed tubes 20 can be placed on and removed from mixture 14 without having any material amount of that pack fall into that mixture and thus contaminate it. By avoiding such contamination, both the pack 22 and the mixture 14 can be reused. Mixture 14 can be made more fluent as by using a fluent form of alumina for its inert ingredient. Tabular alumina powder having particles about 100 to 300 microns in size are suitable for this purpose.

The retort 10 and tubes 20 become fairly heavily chromized after a few runs, so that there is no need to make them of anything more expensive than inexpensive stainless steel.

The process of Example 1 can be used with other nickel-base superalloys such as U-500, IN-738, IN-713 or U-700, as well as with cobalt-base superalloys including WI-52, Mar-M 509, PWA 657 and X-40, to prepare a chromized, or a chromized then aluminized, product. If desired the chromizing can be uniformly applied over the entire workpiece either by the gas phase arrangement omitting pack 22, or by pack diffusion in which event the entire workpiece is imbedded in the pack with or without the help of tubes 20. The gas phase treatment applies less chromium as well as very little or no alpha-chrome, and does not increase the workpiece dimensions very much. When it applies a chromized case about 0.7 mil thick, about one-third that case thickness is thickness that adds to the original workpiece dimension. The remainder of the case thickness represents the original surface of the workpiece.

Hollow engine vanes or other types of hollow workpieces can also be diffusion coated in accordance with Example 1, and if the hollow interior opens on its exterior, some coating will also form in that interior. Where the internal surface of a hollow workpiece does not require heavy case formation the hollow interior need not be packed with a diffusion-coating pack but can merely be left in communication with the gas space in the retort. To improve the gas phase chromizing of such interiors, without complicating the operation unduly the interior can be coated with uniform layer of chromium particles as described in application Ser. No. 089,949 filed Oct. 31, 1979. Alternatively, the retort can be equipped with a gas circulator such as the rotor of U.S. Pat. No. 3,353,936 to propel the retort gas through the workpiece interior during the chromizing operation. A series of hollow vanes can thus be disposed around the periphery of such rotor, each vane having the passageway to its interior located close to the rotor margin and oriented to directly receive gas propelled by the rotor.

The diffusion-coating powder mixture used with the gas phase chromizing need not cover the retort floor but can leave a portion of the floor bare to receive workpieces and/or the rotor. Indeed the diffusion-coating powder mixture can be held entirely off the floor, in baskets for example as in U.S. Pat. No. 3,353,936.

When chromizing the interiors of very long lengths of tubing in a furnace without enclosing the tubing in a gas-tight retort, there is a tendency for oxidation of the surface being chromized. This tendency can be reduced by closing the ends of the tubing with caps that contain an extra supply of chromizing pack or other material that combines with or blocks passage of oxygen and moisture. FIG. 2 shows such a modified capping arrangement.

In FIG. 2 the end of a steam boiler tube 50 having an inside diameter of 2 inches and a ½ inch wall thickness is covered by a cap 52. The cap is a welded-together assembly of an end wall 54 and a tubular flange 58 which loosely fits over the end of pipe 50.

The tube 50 is filled with diffusion coating pack, more pack is poured into the cap 52, and the cap then fitted over the tubing end. A little extra pack 60 thus becomes located beyond the end of the tube and reduces the tendency for any oxidizing effect in the interior of the tube. If there is a little clearance 62 between the outside surface of tube 50 and the inside surface of flange 58, the flange 58 can be tack-welded to the tube for the purpose of securing the cap in place. No significant clearance is needed, and the cap can then be frictionally held in place.

The internal pack is a highly fluent composition that is easily poured into place before the heat, and some of it may find its way into the clearance space 62. It is also readily removed after the heat is completed, using a minimum of mechanican poking and the like. As described in application Ser. No. 752,855 such a pack is particularly desirable for packing of cramped recesses in the interior of workpieces, such as in the narrow bores described above, or in hollow jet engine blades, or the like.

Example 2 of application Ser. No. 752,855 describes the diffusion coating of steam generator high pressure tubing made of Croloy alloy (1.9 to 2.6% Cr, 0.97 to 1.13% Mo, 0.15% C, balance essentially iron) having a ¾ inch bore and a ½ inch wall thickness. That diffusion coating included the chromizing of the tube's interior and the aluminizing of the tube's exterior. The chromized case was 1.8 to 2.3 mils thick, with an outer portion about 0.3 mil thick rich in chromium carbide, and an inner portion of columnar chromized structure. This case is particularly effective in reducing erosion of the internal tube surface by rapidly moving high pressure steam.

The aluminized outer surface prolongs the life of the tube in a coal- or oil-fired furnace where it is subjected to combustion atmospheres at temperatures as high as about 1000° F.

For some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs as described in application Ser. No. 752,855.

Any ferrous base steam boiler tubing is improved by the last-mentioned diffusion coatings. Those plain carbon and low alloy steels that will form the chromium carbide stratum with the underlying columnar chromized case will show very little abrading loss when used with high pressure steam. Such abrasion by the steam causes the steam to carry along with it the abraded particles and they can damage the vanes and blades of turbines driven by the steam. For such pressurized use the boiler tubing should have a wall thickness of at least about 3/16 inch.

The external surfaces of boiler tubing are also made more resistant to corrosion as a result of the aluminizing or the chromizing described above, even the minor chromizing effected when only the interior of such a tube is packed with the diffusion chromizing mix.

It is not necessary to diffusion coat the external surfaces of such tubes or to diffusion coat those external surfaces with aluminum. The internal bores of such tubes can be chromized for instance without the use of a covering layer on their exterior. Such chromizing in the retort arrangement described in Example 2 of application Ser. No. 752,855 will produce a distinct outer chromized case in addition to the above-described internal case, but the outer case will generally not show the carbide stratum and will have less chromium pick-up.

The foregoing inner and outer coatings can be applied to tubes as long as 40 feet or more in length, whether those tubes be straight or cane-shaped. For such long tubes it is desirable to effect the diffusion coating uniformly along the tube lengths, and to this end the diffusion coating temperature along the length of the tube can be closely controlled.

As also pointed out in application Ser. No. 752,855 an argon washing atmosphere can be maintained in place of the hydrogen washing atmosphere of its Example 2, without significantly different results. Because of its expense, the flow of argon should be reduced to a very small rate by back pressuring it equivalent to 1 to 2 inches of water. Alternatively, that diffusion can be effected in a glass-sealed retort with an autogenously generated atmosphere.

Chain saw cutter blades are examples of other workpieces that can be diffusion coated to improve their operation. In some cases the cutting edge of a chain saw blade is the narrow edge face on a steel flange, one surface of the flange being very hard and the opposite surface of the flange being relatively soft. The edge face connects those two surfaces and is preferably tapered so that the edge of the harder surface projects out further than the edge of the softer surface, thus providing good cutting action. During use the edge face wears with the softer portion wearing faster than the harder portion so that the cutting effectiveness of the edge face is maintained quite well.

More generally however the cutting edge of such a blade can be diffusion chromized throughout to greatly harden it, particularly if the blade is made of low alloy high-carbon steel. To provide maximum hardening the workpiece can be subjected to carburizing conditions as well as to chromizing, so that the chromium that diffuses into the surface of the blade forms a carbide higher in carbon content that $Cr_{23}C_6$.

The carburizing and chromizing can be effected in separate operations, or in a single step. The following example shows a chromizing followed by a carburizing, effected on a low alloy high-carbon steel of the following composition:

0.65% carbon
0.3% manganese
0.75% nickel
0.5% chromium
0.15% molybdenum
balance essentially iron

EXAMPLE 2

These cutters are cleaned and imbedded in a pack made up of a pre-fired mixture of 20% chromium powder and 80% alumina powder, by weight, to which mixture is added ½% ammonium chloride. The pack is held in a retort which is then heated in a hydrogen-bathed atmosphere to 1600°-1650° F. where it is kept for 5 hours. Upon cooling the cutters show a chromized case 0.4 to 0.5 mil thick.

The chromized cutter blades are then carburized in a carbon monoxide atmosphere where they are held at 1550° F. for 2 hours. The resulting blades show a small increase in case depth as well as long life. Other carburizing techniques such as described in the Kirk Othmer Encyclopedia of Chemical Technology, Second Edition, Volume 13, pages 304 through 308 (1967), can also be used with equivalent results.

Both the chromizing and the carburizing can be carried out in the same retort, as for example by suspending the cutter blades in the retort, then introducing a chromizing gas such as described in U.S. Pat. No. 3,222,212, after which such gas is displaced by carbon monoxide or methane or other carburizing atmosphere. The temperature of both treatments can be close to each other, or several hundred degrees apart, as desired. Simultaneous chromizing and carburizing is not very effective.

The weight gain of the blades can be followed to make sure the above-noted high proportion of carbon-to-chromium has been introduced into them. Such proportions give very long-lived cutters, but lower proportions can be used.

If desired the chromizing can be accomplished with a pack that contains a small amount, about 1 to 2% by weight, of metallic magnesium powder. This further improves the durability of the case whether or not it is subsequently carburized.

Aluminide coatings can be removed from superalloys where fresh coatings are needed, and even to vary the coating thickness, by the processes described in U.S. Pat. Nos. 3,458,353 and 3,622,391. These processes use dips in stripping solutions of aqueous nitric acid containing dissolved fluoride. A preferred stripping solution contains about 3 to about 20 weight percent of dissolved fluoride computed as hydrogen fluoride.

While such stripping solutions are highly effective at moderate temperatures, e.g. 50° to 115° F., their action on some coatings is sometimes slow. The stripping can be accelerated by a follow-up dip in essentially fluoride-free aqueous nitric acid having about 10 to about 30 weight percent acid, for at least about 5 minutes. Even speedier removal is effected by repeating the fluoride-containing and fluoride-free nitric acid dips, with an intervening water rinse.

A particularly desirable sequence is shown in the following example.

EXAMPLE 3

A number of INCO 713 aluminized first stage blades are subjected to the treatment steps:
(a) Clean with a blast of dry 220 grit aluminum oxide propelled by a jet of air from a 30 psig source.
(b) Immerse for 30 minutes at 80°-90° F. in a fluoride-containing nitric acid solution prepared by dissolving 2 ounces of ammonium bifluoride and 10 fluid ounces of 70% nitric acid, in sufficient water to make one gallon.
(c) Rinse with running water.
(d) Rinse ultrasonically in water for two minutes.
(e) Dip for 30 minutes at 90°-100° F. in aqueous nitric acid containing 17 weight percent technical grade $HNO_3$.
(f) Rinse in running water.
(g) Rinse ultrasonically in water for two minutes.
(h) Repeat the sequence of steps (b) through (g) two more times.
(i) Grit blast as in step (a).

Even better results are obtained when the fluoride-free acid solution of step (e) contains 25% $HNO_3$. The temperature of the fluoride-free acid bath can be as low as about 60° F. and as high as about 125° F., and still provide very good action. Higher temperatures tend to generate vapors that make the bath a serious health hazard, and are best avoided. For the same reason the fluoride-containing bath is best operated at from 50 to about 115° F.

The chemical attack of the acid dips stops of its own accord after the aluminide coating is entirely removed, so that there is no great danger in prolonging the dip treatments. However dips longer than about 30 minutes are not particularly helpful and unduly prolong the treatment.

The rinsing between fluoride-free acid dip and a fluoride-containing acid dip that follows, can be omitted. The rinsing between the fluoride-containing acid dip and the fluoride-free acid dip that follows, is helpful in that it keeps the fluoride-free acid from accumulating too much fluoride that can be carried over from the fluoride-containing acid dip. The fluoride-free acid dip should have less than about 0.1% and preferably less than 0.05% fluoride content.

The rinsing liquid need not be water, but can be some other liquid such as cellosolve, chloroform, methylethylketone, alcohols or mixtures of such liquids. Rinsing should be effected after the last acid treatment, before the workpieces are cleaned and dried.

According to the present invention chromizing can also be effected to provide smooth hard low-friction surfaces on hardened steel. Thus gun barrels of high-carbon steel can have their internal bores chromized to form a hard case not over 1 mil thick that improves the operation of the barrel. Barrels having a caliber of 30 hundredths of an inch, or even less, can be improved in this way.

It is generally awkward to make ferrous metal surfaces scrupulously clean. The awkwardness principally involves the formation of smut on the ferrous surface, particularly if it has been subjected to an electrolytic or acid treatment. The smut is probably the residue of some of the resistant constituents of the ferrous metal left behind when the surface of the metal is attacked, and the best technique for removing the smut has been mechanical brushing. Because brushes so used tend to wear out fairly rapidly, the operation of fast-moving production cleaning lines that include brushing is difficult to make completely automatic.

According to another aspect of the present invention the brushing off of the smut is replaced by the steps of depositing on the smutty surface a flash coating of nickel and then subjecting the thus-coated surface to the action of aqueous nitric acid containing a little halide such as $Cl^-$. This rapidly dissolves the nickel coating and also removes the smut. This is exemplified as follows.

EXAMPLE 4

A coil of two mil thick SAE 1010 steel foil is passed through a series of tanks in which it is treated in the following sequence of steps each taking about 1/6 minute:

(a) Alternating current (60 Hertz) electrolytic action as a bipolar electrode at 50 amperes per square foot in an aqueous solution containing 5% NaOH and 5% sodium silicate and held at 150° F.
(b) Reciprocal bipolar electrode electrolytic action at the same current density and in the same bath as in step (a).
(c) Rinse in tap water.
(d) Dip in 1% by weight aqueous inhibited hydrochloric acid.
(e) Rinse in tap water.
(f) Passage through a nickel flash plating bath in which it is cathodically treated for three minutes at a current density of 20 amperes per square foot. The bath is an aqueous solution of 213 grams $NiCl_2.6H_2O$ and 35 cc. 20% aqueous HCl, in 500 ml. water and is held at about 70° to 100° F.
(g) Rinse in tap water.
(h) Dip in 20% by weight aqueous nitric acid containing 0.1% by weight hydrochloric acid.
(i) Rinse in tap water.

After emerging from the final rinse the foil is clean and no smut is detectable. It can now be loosely coiled as described in U.S. Pat. No. 3,222,212 for diffusion coating, or given any other kind of coating.

The nickel flash can be deposited from acid or alkaline plating baths and need only weigh about 0.05 milligram per square centimeter. Greater coating weights do not help the smut removal significantly and coating weights over about 0.3 milligram per square centimeter generally take too long to apply and are too expensive. An electroless nickel flash can be used but it is not as effective.

The smut removal of the present invention can be effected on high-carbon steels as well as on alloy steels including stainless steels and does a very good job on flat or curved surfaces. Surfaces that are too concave or convex should be plated with the help of anodes so shaped and located that a fairly uniform flash coat is deposited, in order to make sure the flash is deposited all over the surface in the least time.

The nitric acid content of the flash-removing solution can range from about ½% to about 40% by weight, and should contain about 20 to about 200 times as much nitric acid as halide ion. While hydrogen chloride is a very convenient source of halide ion, any chloride, bromide, iodide or fluoride that dissolves and dissociates in the nitric acid solution, sodium or calcium chlorides for instance, are suitable sources.

The desmutting technique of the present invention is particularly desirable for use on surfaces that are not flat, or are not readily accessible for mechanical scrubbing. Thus an expensive sand-blasting operation is eliminated in the preparation of AN 355 jet engine blades for diffusion aluminizing and top coating by the process described in U.S. Pat. No. 3,948,689 and U.S. patent application Ser. No. 953,762 filed Oct. 23, 1978. Such blades are very effectively given the following sequence of treatments.

EXAMPLE 5

The blades are subjected to steps (a), (b) and (c) of Example 4, followed by ultrasonic treatment at about 50,000 Hertz in tap water for one minute. They are then dipped in ½% by weight aqueous uninhibited hydrochloric acid, followed by the flash coating of step (f) in Example 4, but with only 30 seconds of cathodic action at 40 amperes per square foot. This is then followed by another rinse in tap water and a strip in 15% by weight aqueous nitric acid containing 0.15% sodium chloride, another tap water rinse, a repeat of the foregoing ultrasonic treatment and another nickel flash coating. This flash coating is applied for two minutes at 40 amperes per square foot using the same nickel plating bath. The resulting flash-coating blade is rinsed in tap water, permitted to dry and packed in the aluminum diffusion coating pack of Example 1 in Ser. No. 953,762, and subjected to the diffusion coating there described. After the aluminizing the blades are removed from the pack, washed with tap water, and given the top coating of Example II of U.S. Pat. No. 3,948,689.

The resulting blade has a very smooth surface and a long life in a jet engine compressor.

The nitric acid strip solution should not be kept in contact with the ferrous surface for more than a few seconds after the flash is removed. While nitric acid tends to passivate ferrous surfaces, particularly when this acid is in a high concentration, the passivating action cannot be depended upon to persist very long when the metal is being manipulated.

Obviously many modifications and variations of the present invention are possible in the light of the above teachings. It is therefore to be understood that within the scope of the appended claims the invention may be practiced otherwise than as specifically described.

What is claimed:

1. A steam boiler having a Croloy boiler tube through which pressurized steam is circulated, said tube being connected to a steam turbine to cause the pressurized steam to operate the turbine, the internal surface of the tube having a chromized case the outer portion of which is rich in chromium carbide and the remainder of which has a columnar chromized structure.

2. A Croloy steam boiler tube having a chromized steam-engaging surface case, the outer portion of that case being rich in chromium carbide, and the remainder of the case having a columnar chromized structure.

3. The combination of claim 2 in which the tube surface that is not steam-engaging has an aluminized case.

4. In a steam boiler having a Croloy boiler tube through which pressurized steam is circulated, the improvement according to which the internal surface of that tube has a chromized case the outer portion of which case is rich in chromium carbide and the remainder of the case having a columnar chromized structure.

* * * * *